United States Patent
Katsap et al.

(10) Patent No.: US 11,823,862 B2
(45) Date of Patent: Nov. 21, 2023

(54) METHOD AND APPARATUS FOR USABLE BEAM CURRENT AND BRIGHTNESS IN SCHOTTKY THERMAL FIELD EMISSION (TFE)

(71) Applicants: NuFlare Technology, Inc., Kanagawa (JP); NuFlare Technology America, Inc., Sunnyvale, CA (US)

(72) Inventors: Victor Katsap, Hopewell Junction, NY (US); Chising Lai, Hopewell Junction, NY (US)

(73) Assignees: NuFlare Technology, Inc., Kanagawa (JP); NuFlare Technology America, Inc., Sunnyvale, CA (US)

( * ) Notice: Subject to any disclaimer, the term of this patent is extended or adjusted under 35 U.S.C. 154(b) by 45 days.

(21) Appl. No.: 17/565,014

(22) Filed: Dec. 29, 2021

(65) Prior Publication Data

US 2023/0207257 A1 Jun. 29, 2023

(51) Int. Cl.
*H01J 37/26* (2006.01)
*H01J 37/28* (2006.01)

(52) U.S. Cl.
CPC ............ *H01J 37/265* (2013.01); *H01J 37/28* (2013.01)

(58) Field of Classification Search
CPC .. H01J 37/00; H01J 37/02; H01J 37/26; H01J 37/265; H01J 37/28; H01J 37/06; H01J 37/065; H01J 37/07; H01J 37/22; H01J 37/222
USPC .......................................... 250/306, 307, 311
See application file for complete search history.

(56) References Cited

U.S. PATENT DOCUMENTS

| | | | |
|---|---|---|---|
| 5,923,034 A | 7/1999 | Ogasawara et al. | |
| 6,583,413 B1* | 6/2003 | Shinada | H01J 37/28 250/311 |
| 2008/0174225 A1* | 7/2008 | Tessner | H01J 9/025 313/362.1 |
| 2010/0100835 A1* | 4/2010 | Klaric | G06V 30/422 715/810 |

OTHER PUBLICATIONS

M.J. Fransen, et al. "Brightness measurements of a ZrO/W Schottky electron emitter in a transmission electron microscope," Applied Surface Science, vol. 146, 1999, pp. 357-362.
Japanese Notice of Reasons for Refusal dated Sep. 12, 2023 in Japanese Patent Application No. 2022-185115 filed Nov. 18, 2022, with English Translation, total 12 pages.

* cited by examiner

*Primary Examiner* — Jason L McCormack
(74) *Attorney, Agent, or Firm* — Oblon, McClelland, Maier & Neustadt, L.L.P.

(57) ABSTRACT

The present disclosure is related to a Schottky thermal field emission (TFE) source for emitting an electron beam. Exemplary embodiments can provide the acquisition of high-resolution emission images of Schottky TFE source and compute usable beam current and brightness based on experimentally developed usable current criteria. Advantages of these exemplary embodiments include: (1) obtaining usable beam current and brightness of a Schottky TFE source can be important with reference to Schottky TFE development and quality inspection, and (2) optimizing Schottky TFE operation modes so as to maximize Schottky TFE usable beam current and brightness can enable operation of multi-beam electron optical tools.

15 Claims, 13 Drawing Sheets

METHOD AND APPARATUS FOR USABLE BEAM CURRENT AND BRIGHTNESS IN SCHOTTKY THERMAL FIELD EMISSION (TFE)

TECHNICAL FIELD

The present disclosure is directed to systems, methods, and computer readable media for a Schottky thermal field emission (TFE) source. More particularly, the present disclosure relates to accurate evaluations of a Schottky TFE usable current and brightness to allow for broader applications of Schottky TFEs.

BACKGROUND

A Schottky TFE source can be quite effective for implementing commercial e-beam tools such as a scanning electron microscope (SEM). Inherently, a Schottky TFE emission is strongly non-uniform, with lower emission in the center and high emission on the edges (colloquially referred to as "dog ears"). Conventionally, to support a SEM, the Schottky TFE emission non-uniformity is effectively filtered by the application of a very small beam-defining aperture (BDA) that may allow only electrons emitted from the center to be transmitted. This conventional solution may not be effective to support other applications, such as multi-beam (MB) tools, e.g., multi-beam lithography or inspection tools. For these applications, BDA may not applicable, since forming multiple beams can require a high incident beam current, typically >10 µA. Therefore, one needs to know what part of the initially emitted beam of a Schottky TFE source may be used to form multi-beam flow, and what brightness the Schottky TFE source may provide in a multi-beam mode.

SUMMARY

The present disclosure is related to a Schottky TFE source for emitting an electron beam. Exemplary embodiments can provide the acquisition of high-resolution emission images of Schottky TFE source and compute usable beam current and brightness based on experimentally developed criteria. Method steps can include configuring one or more processors for: acquiring and storing a Schottky TFE emission image of a Schottky TFE source in a digital format; normalizing and summing pixel data values of the Schottky TFE emission image; assigning pixel current based on normalizing and summing pixel data values and a beam current; and determining a Schottky TFE usable current and brightness based on the assigned pixel current and usable current criteria. The assigning of the pixel current based on the normalized and summed pixel data values and the beam current can further comprises assigning each pixel a value proportional to each pixel's intensity, dividing user-provided beam current by the sum of normalized pixel values, and assigning resulting division output. The assigned pixel current can be introduced to each pixel based on a fraction of the beam current. The beam current comprises a beam current comprises a central beam component and an outer beam component. Exemplary embodiments include determining the Schottky TFE usable current and brightness by combining assigned pixel current by pixel normalized values and the usable current criteria, and depending on TFE temperature T, pixels are selected by applying the usable current criteria. System embodiments and non-transitory computer readable medium embodiments can be configured in a similar manner to implement the method steps described above.

In another exemplary embodiment, a system for determining Schottky TFE usable current and brightness of a Schottky TFE system can comprise one or more processors configured to: acquire and store a Schottky TFE emission image in a digital format; and determine usable beam current and brightness for the Schottky TFE based on experimentally developed algorithms that utilize usable current criteria and usable emission current density. The usable current criteria are generated based on properties of central beam component and outer beam component of Schottky TFE beam current. The system can utilize the results of the determined usable beam current and brightness evaluation for the Schottky TFE for operation of multi-beam electronic optical tools.

BRIEF DESCRIPTION OF DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION

Exemplary embodiments of the present disclosure can provide the acquisition of high-resolution emission images of Schottky TFE and computing usable beam current and brightness based on experimentally developed criteria. Advantages of these exemplary embodiments include: (1) obtaining usable beam current and brightness of Schottky TFE, which can be important with reference to Schottky TFE development and quality inspection, and (2) optimizing Schottky TFE operation mode so as to maximize usable beam current and brightness for use in multi-beam electron optical tools.

Embodiments of the present disclosure can allow for accurate evaluation of Schottky TFE usable current and brightness. As previously noted, TFE emission can be strongly non-uniform, with lower emission in the center and high emission on edges (known as dog ears). Since electrons constituting an edge emission are emitted from a TFE cone with very large divergence angles, and from flat tip edge where electrons are emitted in so-called "extended Schottky mode", i.e., electrons are tunneled into vacuum, and therefore have much wider energy spread than electrons emitted from TFE flat tip. Large-angle electrons cause unacceptable aberration (primarily spherical), while wide-energy spread electrons cause unacceptable chromatic aberrations in focused beam spot.

In commercial e-beam tools using Schottky TFE, e.g., SEM, this problem can be solved in a simple way: a very small, so-called beam-defining aperture (BDA), is placed in front of the Schottky TFE in order to only allow electrons to be emitted from the center of the Schottky TFE flat tip. A BDA thus forms an e-beam with low current, typically sub-1 µA. In multi-beam (MB) tools, e.g., multi-beam lithography or inspection tools, a BDA is not applicable, since forming multiple beams can require high incident beam current, typically >10 µA.

As previously discussed, in order to operate in a multi-beam mode, one needs to know what part of the initially emitted beam of a Schottky TFE may be used to form a multi-beam flow, and what brightness the Schottky TFE may comprise in multi-beam mode. Exemplary embodiments as described use a novel Schottky TFE emission imaging approach and employ an experimentally developed algorithm for computing usable beam current and brightness of a Schottky TFE source. As an additional point, in some embodiments, it can be important to have a high-quality, sharp tip for emitting electron beams, as a degraded tip can reduce image quality and resolution. As can be appreciated by one of ordinary skill in the art, many variations can exist.

Figure 1:
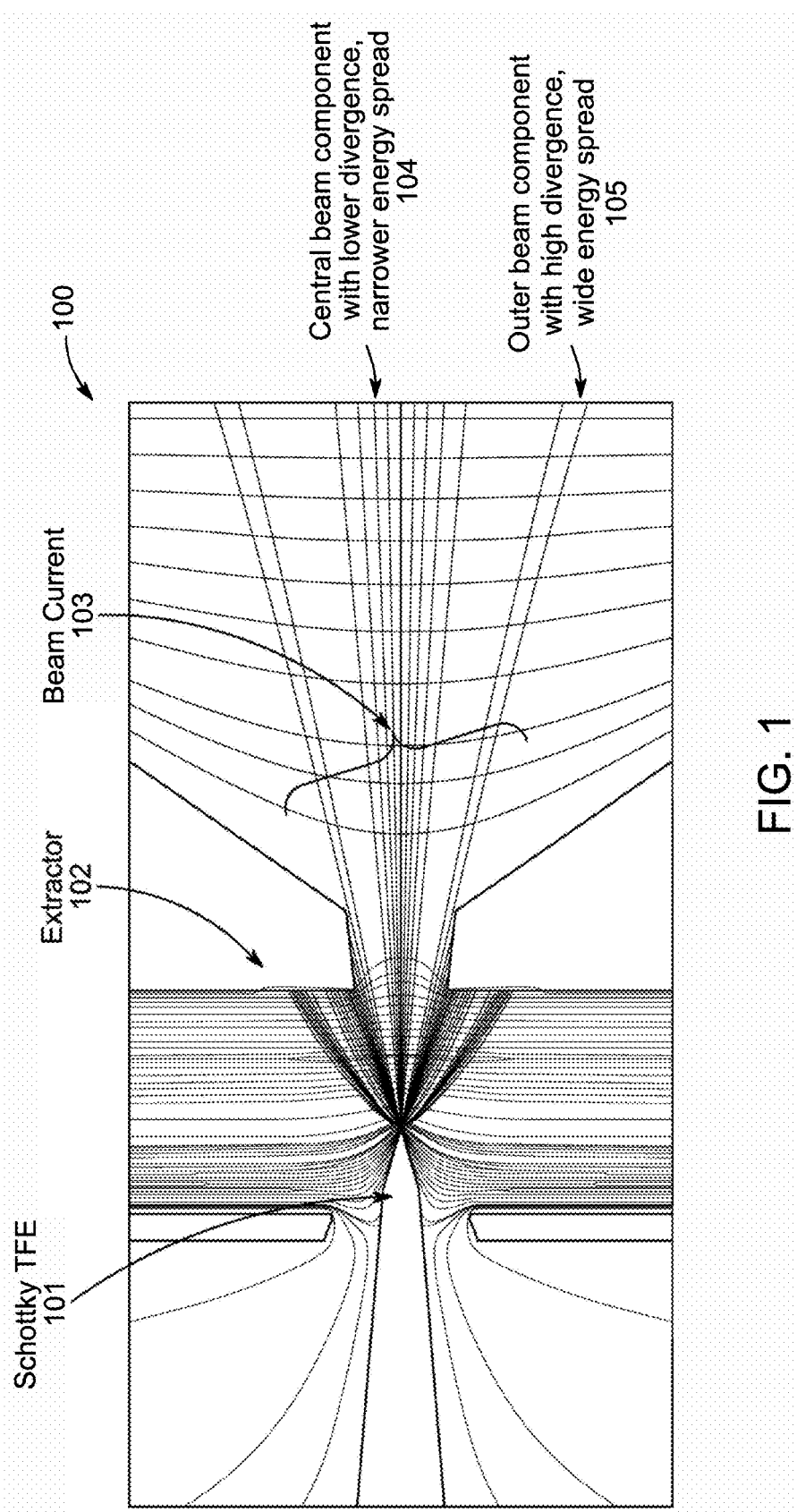
FIG. 1 illustrates the structure of emissions and beam current from a Schottky TFE source, according to some embodiments of the present disclosure.

FIG. 1 illustrates an embodiment 100 of a Schottky TFE source 101 and beam current 103 that is output from a Schottky TFE source 101, according to some embodiments of the present disclosure. As illustrated, Schottky TFE source 101 comprises extractor 102. In one embodiment, an existing method can be based on a running Schottky TFE source 101 in a triode gun mode and measuring three currents, namely, total emission current Itot (comprised of all electrons that are leaving Schottky TFE source 101), extractor current Iext (comprised of electrons intercepted by the extractor electrode), and beam current 103 Ibeam (comprised of electrons that pass-through extractor bore), such that Itot=Iext+Ibeam.

As illustrated in FIG. 1, the TFE tip (horizontal pointed tip in the center of the Schottky TFE source 101) generates the total emission current Itot in multiple directions. Of interest for MB tool applications is the determination of what kind of information can be acquired from the total emission current Itot. The extractor 102 effectively filters the total emission current and generates the beam current 103 Ibeam. The Ibeam comprises two components:

(1) a central beam component 104 with lower divergence, i.e., narrower angles relative to the horizontal axis, and narrower energy spread. In some embodiments, the central beam component 104 can have low-divergence angle (~4 deg to 5 deg), lower energy spread (<1 eV), which are representative values of components of the central core of the beam. The central beam component 104 can be axial symmetric within the central core of the beam.

(2) an outer beam component 105 with high divergence, i.e., wider angles and a wide energy spread, i.e., higher power. In some embodiments, the outer beam component 105 can have high divergence angle (~6 deg to 7 deg), wide energy spread (~1.5 eV), which are representative values of components that form outer envelope of the beam.

The lower-divergence angle, lower-energy spread central core of the beam can be essential to implement high-resolution e-beam tools. Embodiments of the present disclosure allow an evaluation of usable current emitted primarily from the central part of the Schottky TFE source 101. As will be described, this usable current can be a small fraction of beam current as reported by existing methods.

In some embodiments, the electrons emitted by the Schottky TFE tip penetrate a hole in the extractor 102, causing the central beam component 104 to dominate and effectively support the operation of a SEM.

Figure 2:
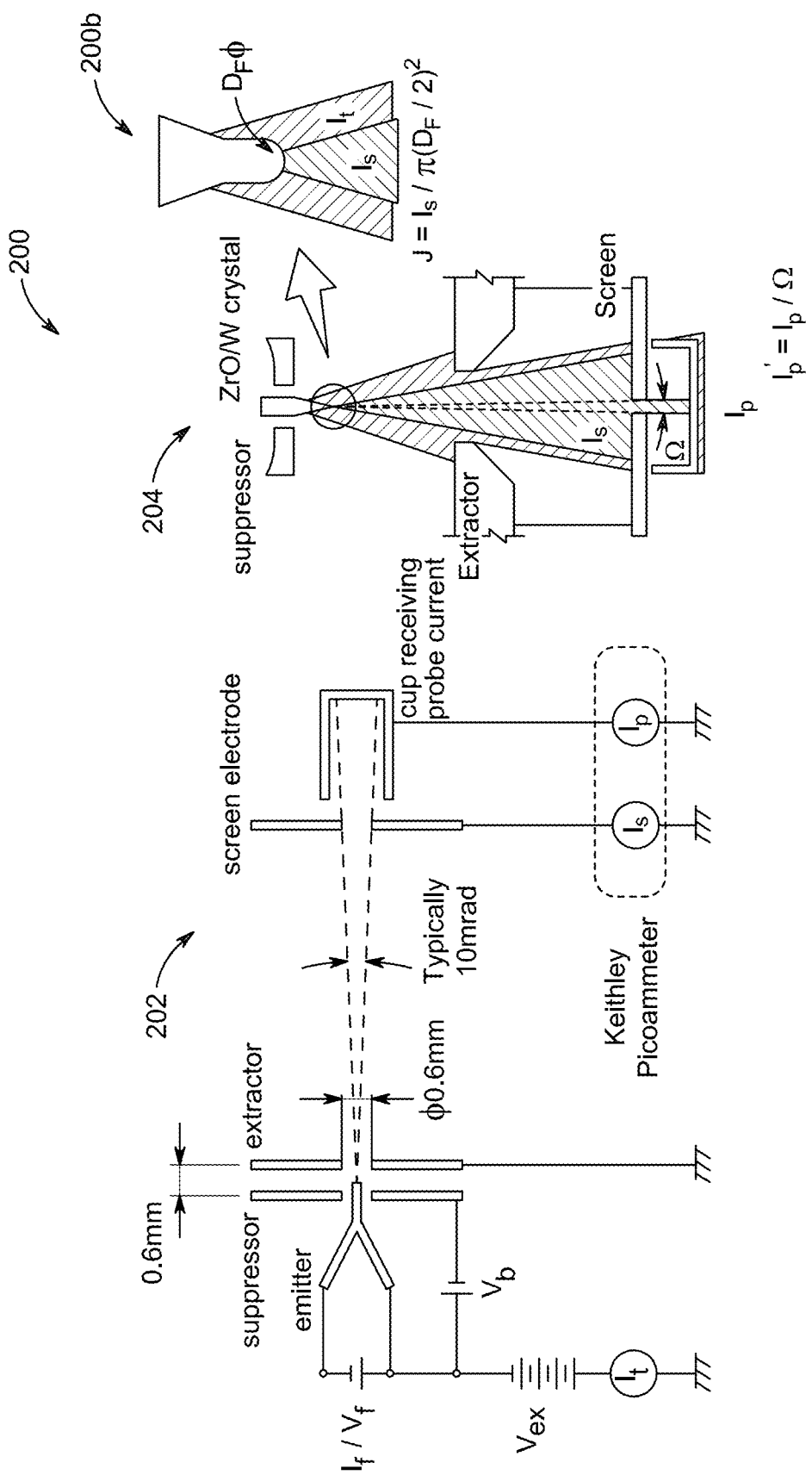
FIG. 2 illustrates a mechanically scanning Faraday Cup (FCup) for beam cross-section characterization, according to some embodiments of the present disclosure.

FIG. 2 illustrates a configuration for emission measurements 200 utilizing a mechanically scanning Faraday Cup (FCup) 202 for beam cross-section characterization, according to some embodiments of the present disclosure. The mechanically scanning FCup 202 comprises an emitter, suppressor, and extractor of a Schottky TFE source and a cup for receiving probe current. Also shown in the configuration for emission measurements 200 is the cross-section of a tip and an extractor 204 of a Schottky TFE source and an enlarged image of the cross-section of a tip of a Schottky TFE source.

The mechanically-scanning FCup 202 can be utilized for beam cross-section characterization. As shown in FIG. 2, the mechanically-scanning FCup 202 intercepts beam within 10 mrad angle, while beam divergence semi-angle is ~100 mrad, so resolution of this measurement is quite low. The resulting mechanically-scanning FCup 202 scan produces low-resolution beam profile, typically with dog ears.

Figure 3:
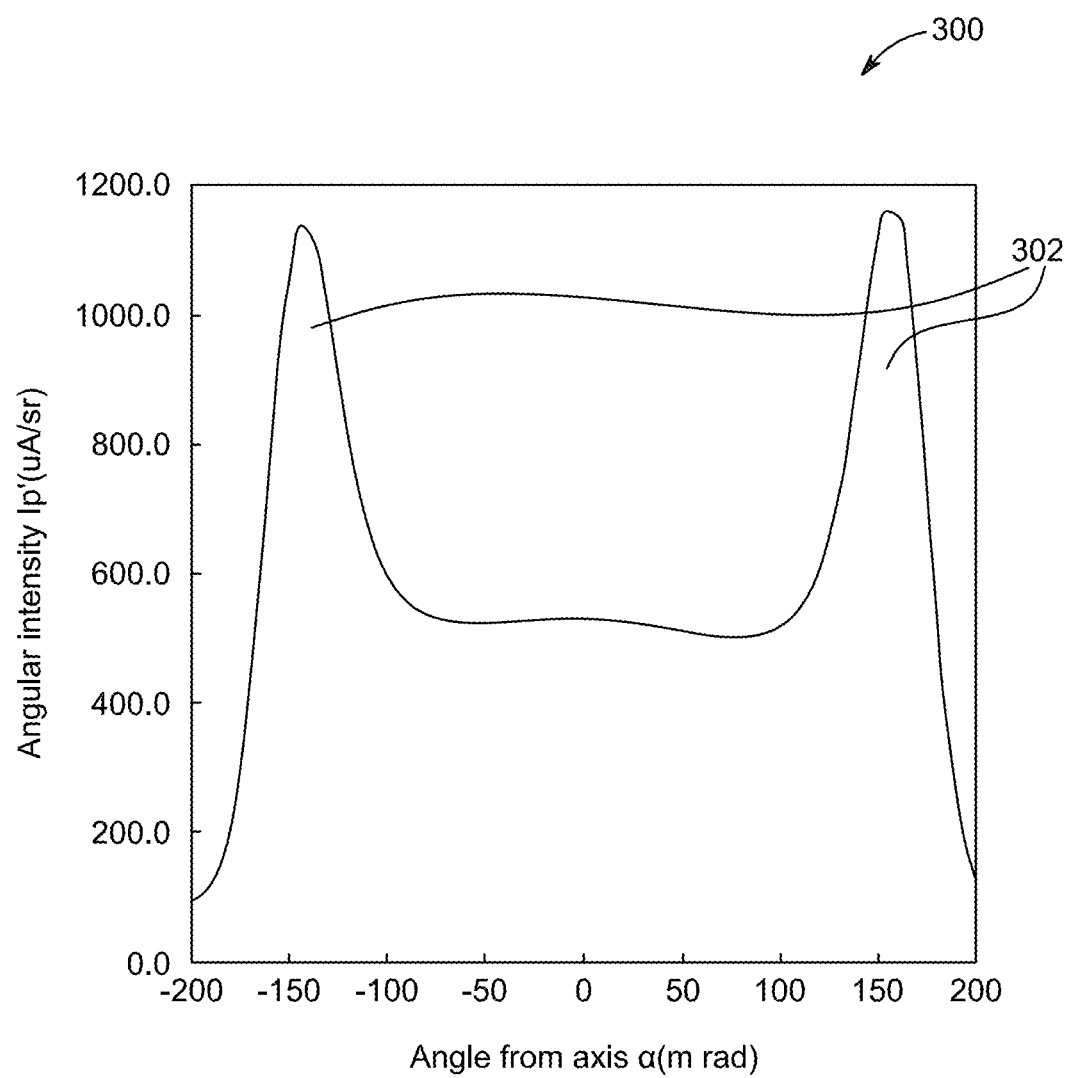
FIG. 3 illustrates a Schottky TFE beam profile with "dog ears", according to some embodiments of the present disclosure.

FIG. 3 illustrates a Schottky TFE emission image profile 300 with dog ears 302, according to some embodiments of the present disclosure. Dog ears 302 are a property of Schottky TFE emission, being formed by electrons emitted from Schottky TFE cone with very large divergence angles, and from a tip edge where electric field strength reaches maximum and electrons are being tunneled into vacuum and therefore have much wider energy spread than electrons emitted from Schottky TFE flat tip. Per FIG. 3, beam current at the dog ears 302 may well dominate the beam current Ibeam. In other words, Ibeam may be comprised mainly of electrons having too large divergence angles and too wide energy spread. As illustrated in FIG. 3, the central beam has an angular intensity I' of approximately 550 μA/sr, whereas the outer beams (i.e., dog ears 302) have an angular intensity I' of approximately 1,150 μA/sr.

Figure 4A:
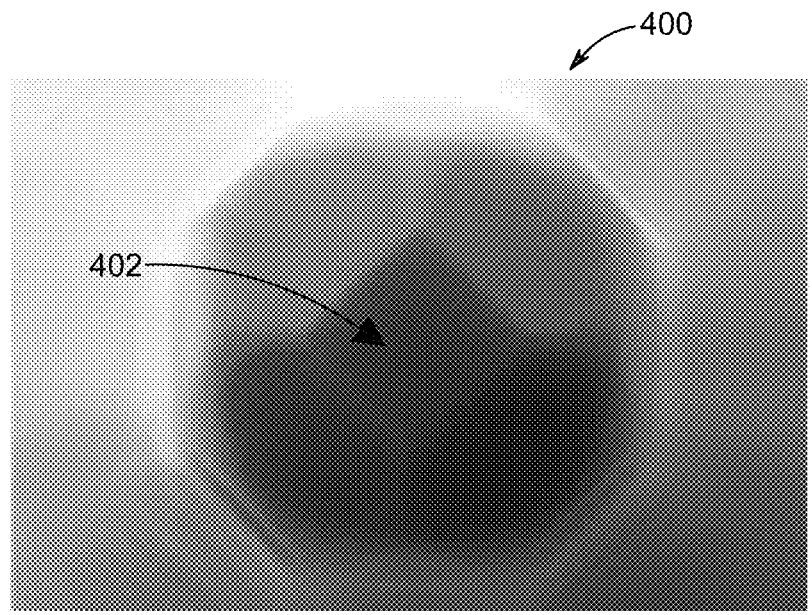
FIG. 4A illustrates the center of a Schottky TFE flat square tip, according to some embodiments of the present disclosure.

FIG. 4A illustrates image 400 of the center of a Schottky TFE flat square tip 402, according to some embodiments of the present disclosure. Electrons that are usable for high-resolution e-beam tools are emitted from central part of Schottky TFE flat square tip 402. In some embodiments, the flat square tip may be a flat circular tip.

Figure 4B:
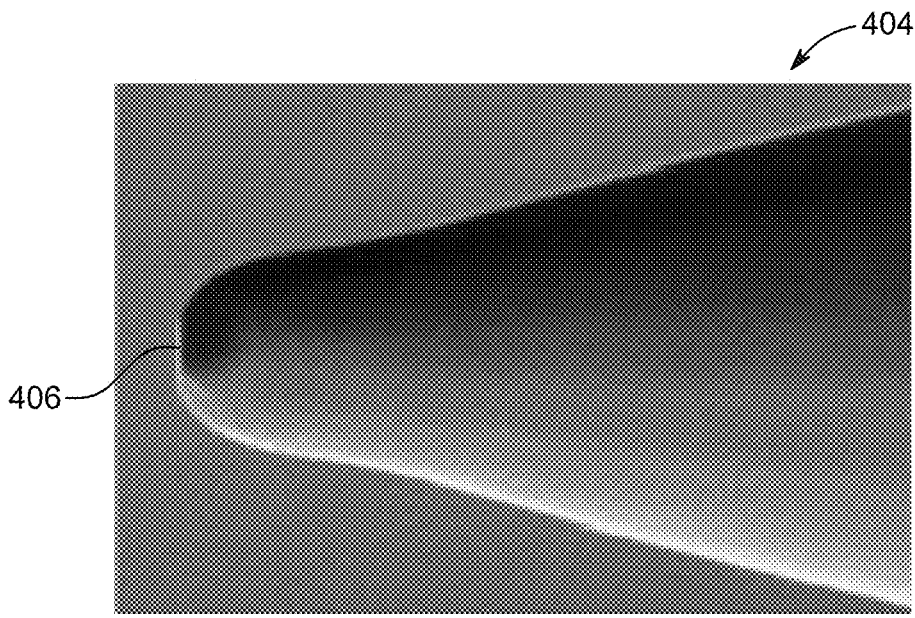
FIG. 4B illustrate a cross-section of a tip of a Schottky TFE source, according to some embodiments of the present disclosure.

FIG. 4B illustrates image 404 of a cross-section of a tip of a Schottky TFE source, according to some embodiments of the present disclosure. At the very end of the tip is the flat square portion 406.

Exemplary embodiments for the systems and methods of the present disclosure use Schottky TFE emission images obtained as described in related U.S. patent application Ser. No. 17/319,208, which is incorporated by reference. The electron-optical apparatus includes a vacuum chamber augmented with electron optics (inside) and magnifying optics (microscope) outside, along with CCD/CMOS camera. More specifically, in one embodiment, the electronic apparatus includes a Schottky TFE source for forming an electron beam, electron optics for adjusting a shape of the electron beam onto a scintillator screen to form an emission image of the Schottky TFE source's tip, and a camera/microscope pair for obtaining a final image of the tip at a desired magnification. Such techniques enable acquiring higher-resolution images at controllable magnifications, which can subsequently be used to identify emission and structural defects.

An electron-optical apparatus for a Schottky TFE source will now be further described. A Schottky TFE source has a tip manufactured/fabricated to emit an electron beam; electron optics configured to adjust a shape of the electron beam thus creating point-projection emission image of the Schottky TFE tip, the electron optics being disposed adjacent to the tip; a scintillator screen configured to generate an emission image when exposed to the adjusted electron beam, the scintillator screen being disposed adjacent to the electron optics and along a trajectory path of the adjusted electron beam; a microscope configured to adjust a magnification of the emission image at the CCD/CMOS camera sensor plane, the microscope being disposed adjacent to the scintillator screen and along the trajectory path of the adjusted electron beam; a camera comprising a camera sensor, configured to generate a final image from the adjusted emission image, the camera being disposed adjacent to the microscope, and the camera sensor being disposed along the trajectory path of the adjusted electron beam; and a vacuum chamber, wherein the Schottky TFE source, the electron optics, and the scintillator screen are located inside the vacuum chamber, and the microscope and the camera are located outside the vacuum chamber.

One embodiment further comprises processing circuitry, electrically connected to at least one of the Schottky TFE source, the scintillator screen, the electron optics, the microscope, and the camera, the processing circuitry being configured to control the Schottky TFE source to emit the electron beam, apply a voltage setting to the electron optics, apply a magnification setting to the microscope, and control the camera to capture the final image.

Figure 5A:
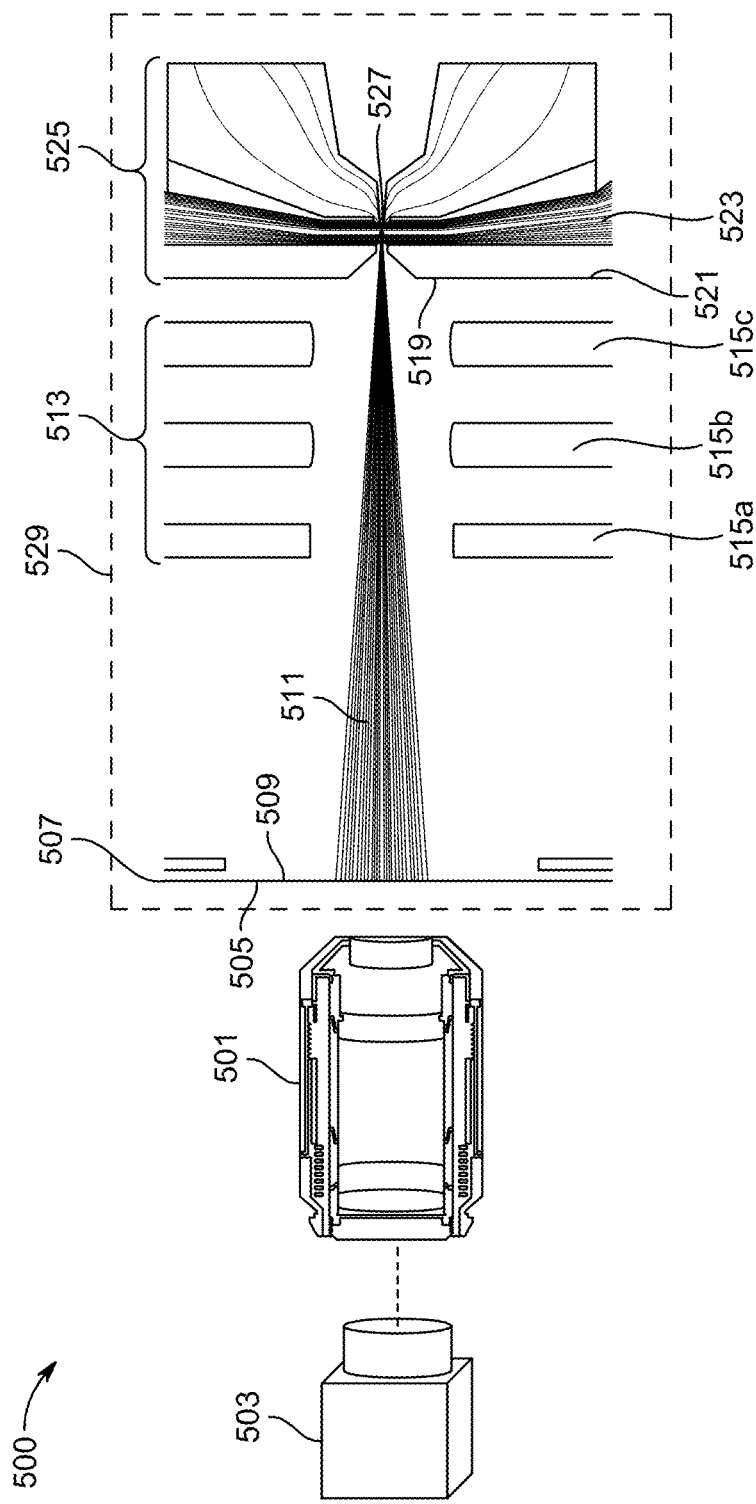
FIG. 5A illustrates a physical structure for viewing and capturing Schottky TFE emission images using a scanning electron microscope (SEM), according to some embodiments of the present disclosure.
Figure 5B:
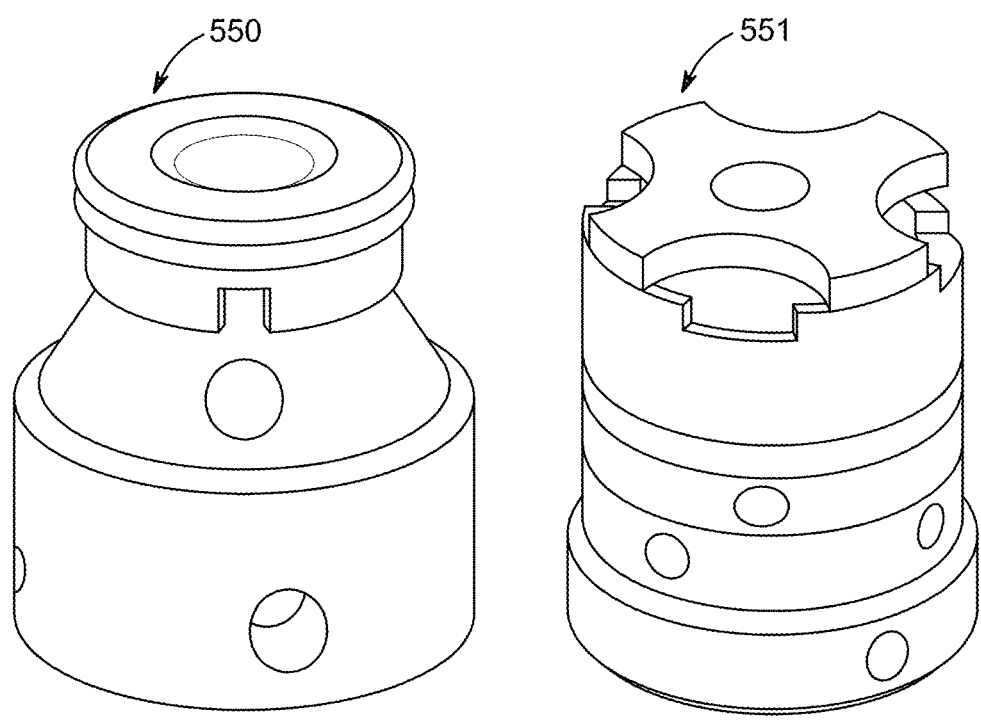

FIG. 5A illustrates a physical structure 500 for viewing and capturing Schottky TFE emission images using a SEM, according to some embodiments of the present disclosure. A Schottky TFE source 525, which includes an aperture plate 519, extractor 521, suppressor 523, and tip 527, is shown. The Schottky TFE source 525 is configured to generate an electron beam 511 directed towards electron optics 513. The electron beam 511 initially diverges, forming a cone-shaped beam.

Electron optics 513 are located between the Schottky TFE source 525 and a first side 509 of the scintillator screen 507. The electron optics 513 includes an electrostatic lens having three electrodes 515a, 515b, 515c configured to adjust a shape of the electron beam 511 by generating an electric field. The electric field created via the electron optics 513 can be controlled by varying the voltage settings applied to the electrodes 515a, 515b, 515c. In one embodiment, voltage settings can be applied to the electrodes 515a, 515b, 515c to generate an electric field that near-collimates the electron beam 511, thereby forming an adjusted (i.e., near-collimated) electron beam. Examples of voltage settings that can be applied to the three electrodes 515c, 515b, 515a, respectively, include: (1) 2,000V, 600V, 350V to create a 3 millimeter diameter image at the scintillator screen 507; (2) 2,000V, 600V, 450V to create a 5 millimeter diameter (magnified) image at the scintillator screen 507; and (3) 2,000V, 600V, 250V to create a 2 millimeter diameter image at the scintillator screen 507. In these examples, only the voltage of electrode 515a was adjusted (increased to magnify image, decreased to de-magnify image), though such adjustments can be made to any one or combination of electrodes 515a, 515b, 515c in other embodiments. Those skilled in the art would understand there is great plurality of electron optics design and layout: electrodes number, shapes, location, and voltages applied.

A scintillator screen 507 is located adjacent to the electron optics 513 and along a trajectory path of the electron beam 511 so that after collimating, the electron beam 511 strikes a first side 509 of the scintillator screen 507. The scintillator screen 507 emits light when impacted by the electron beam 511, the emitted light referred to hereinafter as an emission image. The scintillator screen 507 can also be equipped with mechanically-scanning Faraday Cup for electron beam cross-section characterization.

A camera 503, which includes a camera sensor, and a microscope 501 are also shown in FIG. 5A. In one embodiment, the microscope 501 can be an optical microscope to optically magnify an emission image, though in other embodiments any type of microscope can be used. The microscope 501 is located adjacent to a second side 505 of the scintillator screen 507 and is configured to transfer the emission image generated at the scintillator screen 507 onto the camera sensor plane in the camera 503 with desired magnification/demagnification. The microscope 501 is able to provide a flexible optical interface between the scintillator screen 507 and camera 503, in order to fill the camera sensor, having a fixed size, with the emission image at a desired magnification (e.g., magnify a specific part of the emission image onto the camera sensor, and fit/maintain full emission image onto camera sensor). The magnification of the emission image is done so as to enable a defect on a to-be-inspected Schottky TFE source tip to be picked up by a camera. The camera 503 is configured to generate a final image of the tip 527 from the microscope-adjusted emission image on its camera sensor. In one embodiment, the camera 503 can be a charge-coupled device (CCD) camera. In another embodiment, the camera can be a complementary metal oxide semiconductor (CMOS) camera. In another embodiment, the camera has a resolution (pixel size) less than or equal to 1.5 microns. Further, the camera 503 can be configured to have specific settings, such as a particular exposure time, frame rate, gain, or offset.

In FIG. 5A, the Schottky TFE source 525, electron optics 513, electron beam 511, and scintillator screen 507 are located in a vacuum chamber 529 configured to maintain a vacuum state, whereas the microscope 501 and camera 503 are located outside the vacuum chamber 529.

With incorporation of the microscope 501 and electron optics 517, image characteristics of the final image, such as the size and resolution of the image captured by the camera 503, can be controlled. For example, if a larger image needs to be captured, the electron beam 511 can be widened by adjusting the voltage(s) on electron optics 517. As another example, if a more detailed image needs to be captured, the microscope 501 can alter the trajectory of the emission image to be larger on the camera sensor. As another example, if the final image generated by the camera 503 is too large, the electron optics 513 can decrease the width of electron beam 511, or the microscope 501 can alter the emission image to be smaller on the camera sensor.

Utilizing the electron optics 513, for electro-optically magnifying, and the microscope 501, for optically magnifying, together can achieve images with more detail than in certain scenarios where only one of the electron optics 513 or microscope 501 is used. For example, if an image is electron-optically magnified by 10,000× without being optically magnified, emission image would not fit into camera sensor area, and many details would be lost. As another example, if an image is optically magnified by 400× without being electro-optically magnified, an image equal in magnification as the tip, or 1×, is projected onto the scintillator screen. The image size at the scintillator screen would be ~300 nm, which is smaller than the dominant wavelength of scintillator light, i.e., 550 nm. In such a case, an object smaller than the wavelength of light cannot be imaged and resolved.

In one embodiment, the size and resolution of the image can be controlled by configuring a magnification setting of the microscope 501 and/or a voltage setting of the electron optics 517 beforehand using predetermined settings (e.g., from a look-up table). In such a scenario, a final image having desired image characteristics, such as a specific size or resolution, can be obtained without needing any additional tuning. In another embodiment, the magnification setting and/or voltage setting can be tuned in real-time until the final image has desired image characteristics. In one exemplary scenario, a user can view an initial final image, and tune the microscope and/or electron optics to tweak the final image until it has a desirable size and resolution.

Figure 6A:
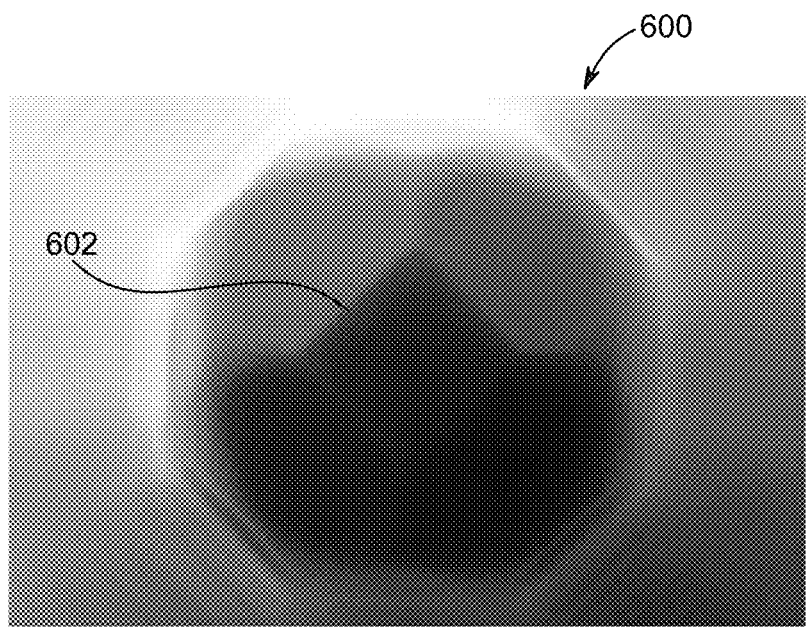
FIG. 6A is an image of a Schottky TFE source tip captured using a SEM, according to some embodiment of the present disclosure.
Figure 6B:
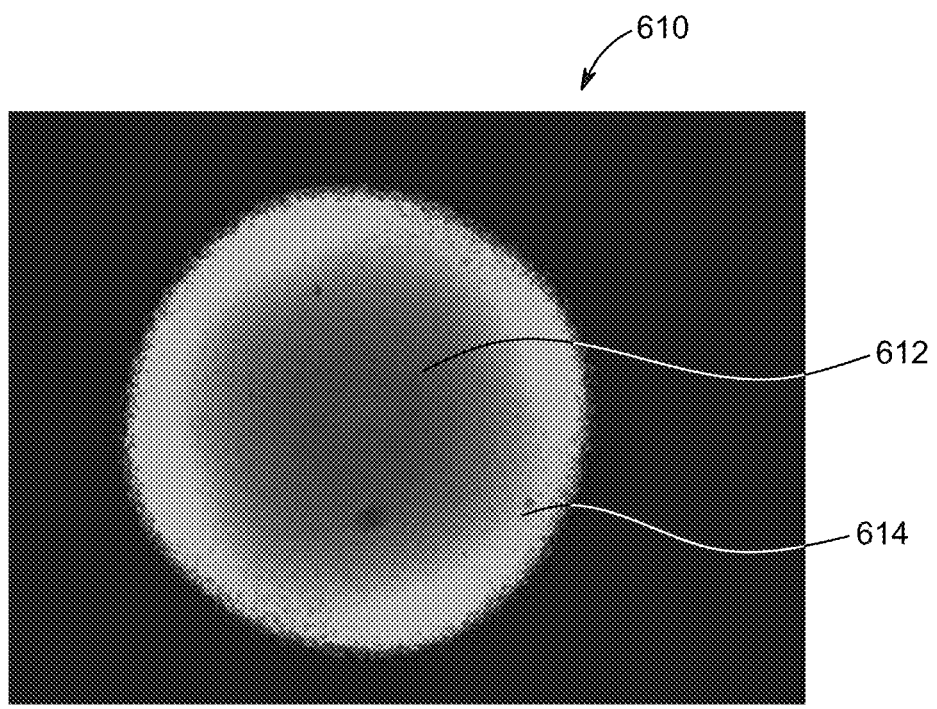
FIG. 6B is a tip emission image of the Schottky TFE resulting from the Schottky TFE source tip of FIG. 6A, according to some embodiments of the present disclosure.
Figure 6C:
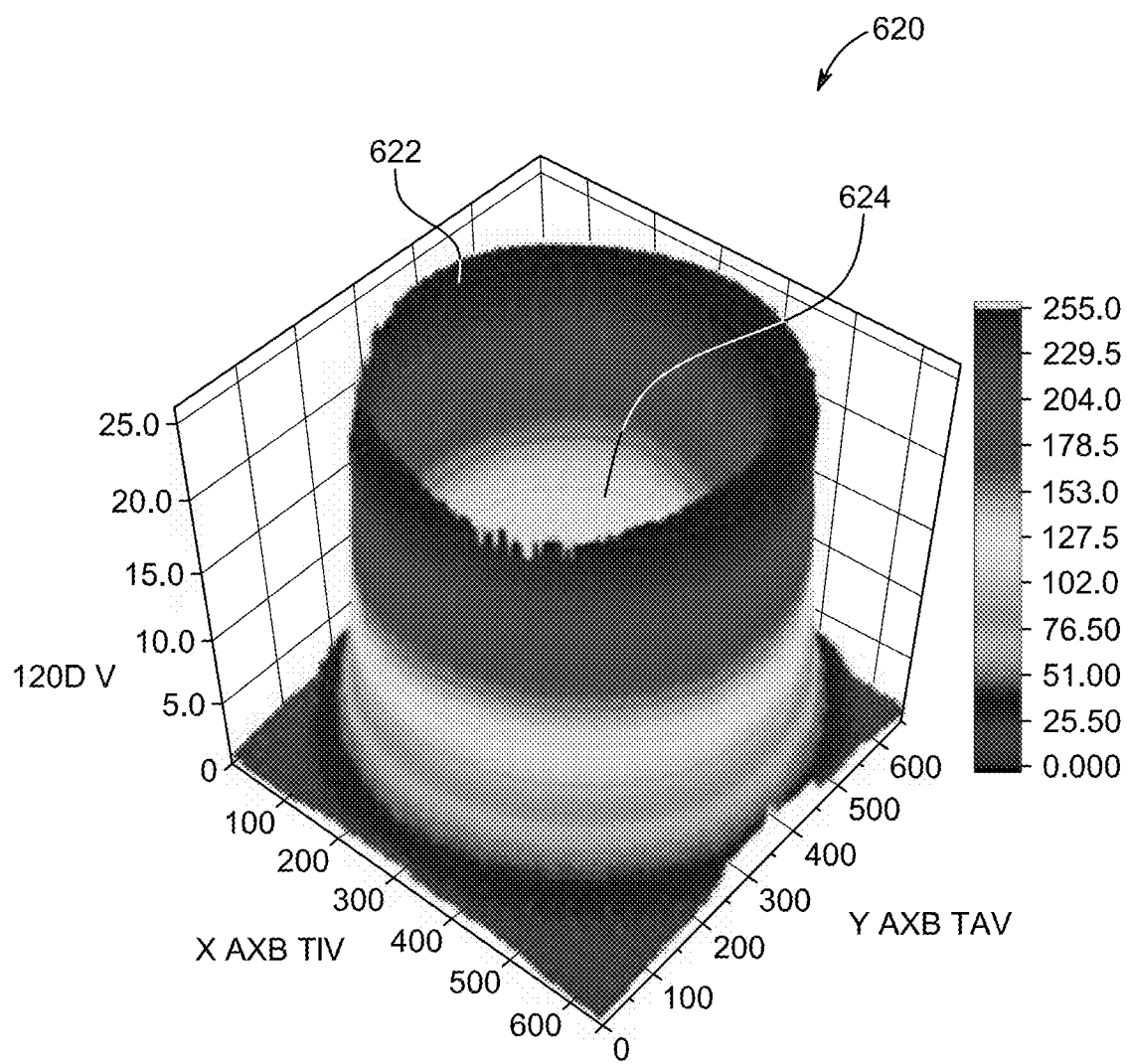
FIG. 6C illustrates a Schottky TFE emission image 3D rendition based on the tip emission image of FIGS. 6A and 6B, according to some embodiments of the present disclosure.

Examples of Schottky TFE emission images 600, 610 and 620 are shown in FIGS. 6A, 6B, and 6C. FIG. 6A is an image of a Schottky TFE source tip captured using a SEM, according to some embodiments of the present disclosure. Note the square tip in the center of the image 602.

FIG. 6B is a tip emission image of the Schottky TFE source resulting from the Schottky TFE source tip of FIG. 6A, according to some embodiments of the present disclosure. Note the central beam component of the image is a darker color 612 and the outer beam components are a lighter color 614. As previously described relative the FIG. 1, the central beam component has a lower divergence, and narrower energy spread. The outer beam component has a high divergence and a wide energy spread.

FIG. 6C illustrates a 3D rendition of a Schottky TFE emission image 620 based on the tip emission image of FIGS. 6A and 6B, according to some embodiments of the present disclosure. The outer (edge) beam components 622 have high intensity, while the central beam components 624 have low intensity. An objective is to determine how much current is contained in the low intensity part, i.e., central beam components 624, which has emissions with low divergence (small angles) and narrower (low) energy spread.

Figure 7A:
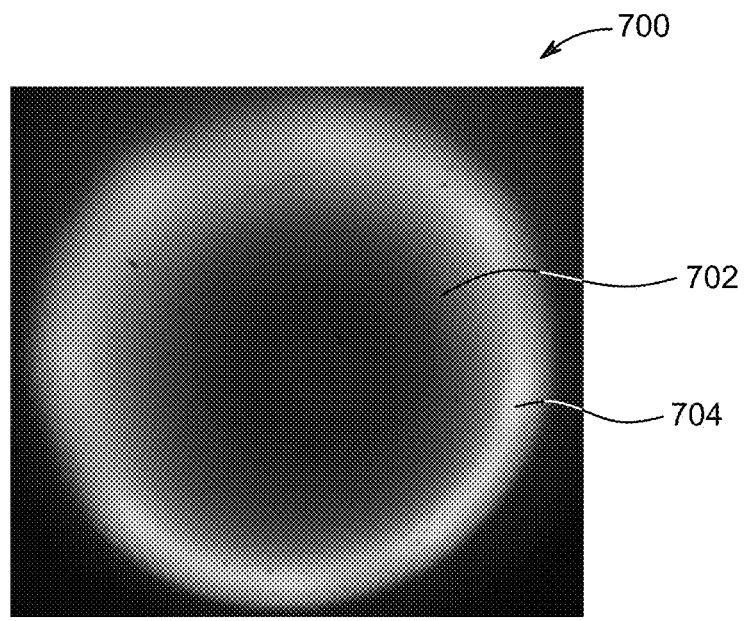
FIG. 7A is an image of a Schottky TFE source tip captured using the techniques described herein, according to some embodiments of the present disclosure.

FIG. 7A is an image of a Schottky TFE source tip 700 captured using the techniques described herein, according to some embodiments of the present disclosure. FIG. 7A shows a dark color surface 702 for the center beam current, indicating a low intensity beam current, and a light color surface 704 on the outer beams indicating a high intensity beam current. The light color surface 704 represents the dog ears of the Schottky TFE source tip.

Figure 7B:
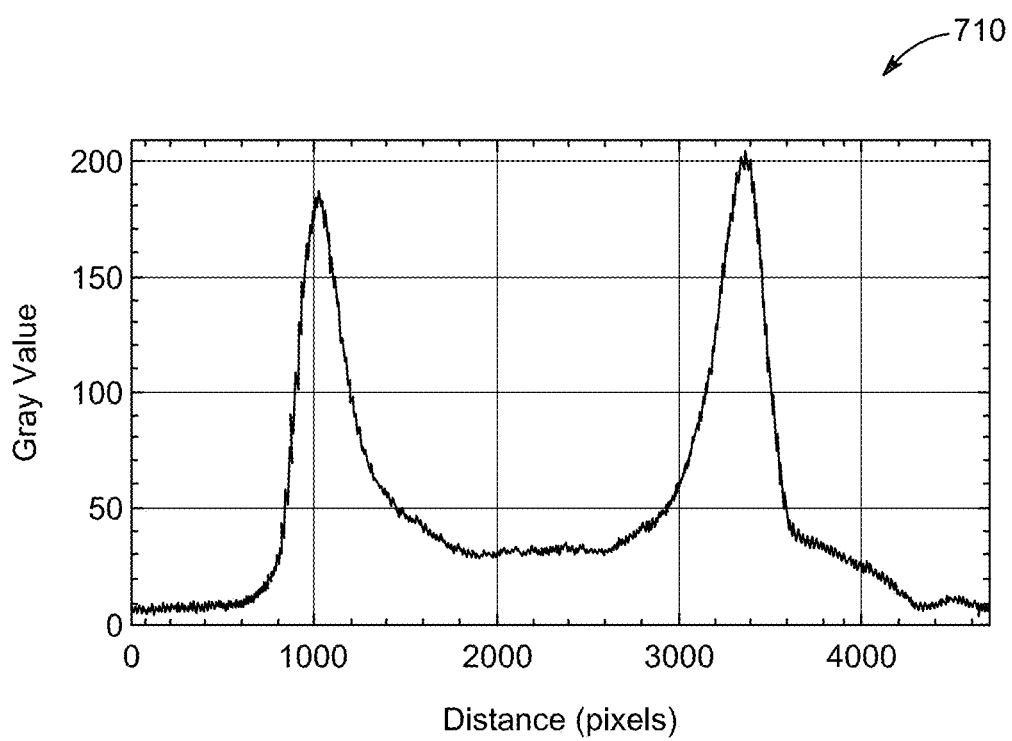
FIG. 7B illustrates an Schottky TFE emission profile including "dog ears" based on the image of FIG. 7A, according to some embodiments of the present disclosure.

FIG. 7B illustrates a Schottky TFE emission image profile 710 of the image of FIG. 7A, according to some embodiments of the present disclosure. The Schottky TFE emission image profile 710 shows strong dog ears.

A method for determining Schottky TFE usable current and brightness can operate as follows using an emission analyzer: (1) Schottky TFE emission image is acquired and stored in a memory in an appropriate digital format, e.g., .PNG, .BMP; (2) a digitized emission image is loaded into the emission analyzer software application; (3) specific TFE parameters such as flat tip size, temperature, and beam current are loaded into the emission analyzer software; (4) the emission analyzer software, using a specific algorithm, computes the usable beam current and corresponding brightness; and (5) the emission analyzer software issues report on computed values.

Figure 8:
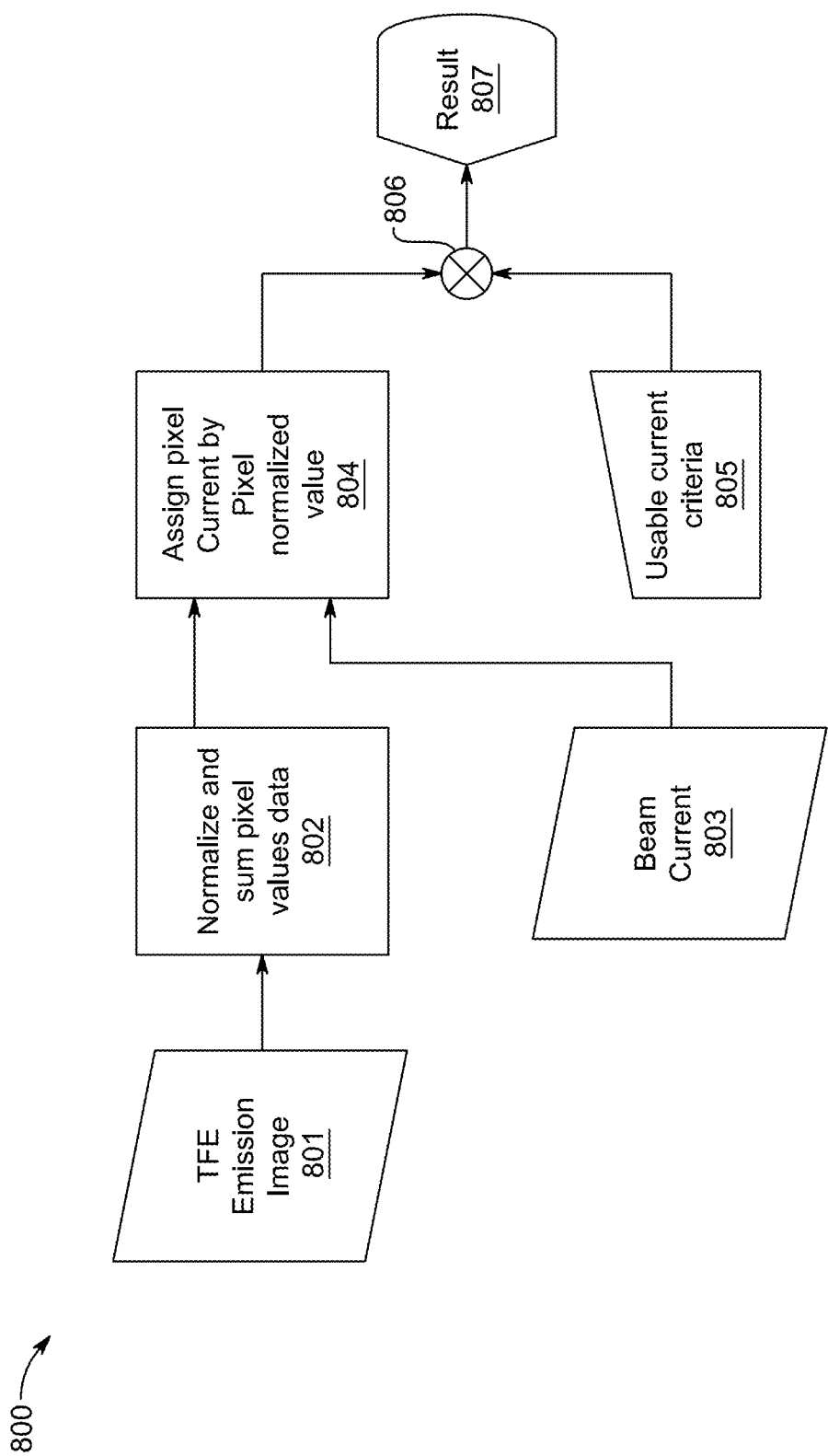
FIG. 8 illustrates a flowchart for evaluating Schottky usable current and brightness, according to exemplary embodiments of the present disclosure.

FIG. 8 illustrates a flowchart 800 for evaluating Schottky TFE usable current and brightness, according to exemplary embodiments of the present disclosure. Referring to FIG. 8, the method includes:

Step 801: acquiring and storing a Schottky TFE emission image in a digital format.

Step 802: counting pixels in a Schottky TFE emission image; summing up normalized pixel values; and normalizing the value with reference to maximum intensity.

Step 803: acquiring a beam current comprising a central beam with lower divergence and lower energy spread and an edge (outer) beam current with a high divergence and high energy spread.

Step 804: assigning each pixel a value proportional to its intensity; dividing a user-provided beam current by the sum of normalized pixel values; and assigning a resulting division output, i.e., fraction of beam current, to each pixel.

Step 805: depending on the Schottky TFE temperature T, selecting pixels by applying the following criteria of usable current:

The value of normalized pixel values P, with respect to a maximum value pixel current value, are based on the usable current criteria, and is equal to $$P = A_o + A_1 * \text{EXP}(T/b), \text{ where,}$$

$A_o$=a first usable current criterion, measured in percentage, $A_1$=a second usable current criterion, measured in percentage, T=Schottky TFE temperature measured in degree K, b=third usable current criterion, measured in degree K, wherein the usable current criteria are based on experimentally developed criteria.

Step 806: summing selected pixels currents based on usable current criteria to determine usable beam current.

Step 807: evaluation result and issuing report with graphical illustration.

Per the aforementioned steps, assigned pixel currents of the pixels, meeting the first, second, and third usable current criteria, are summed up to form usable current, and area S is determined by the pixels meeting the first, second, and third usable current criteria, wherein the usable current and area S determine usable emission current density, Jem. Area S is an area from which the usable current is generated. The usable current criteria are generated based on the properties of the central beam component of the total Schottky TFE beam current. Typically, the central beam component can be 20-30% of the maximum value of the beam current. Accordingly, the outer (edge) component (dog ears) can be 70-80% of the maximum value of the beam current.

Usable Schottky TFE brightness, Bri, can be computed based on usable current, the temperature T and the area S, wherein:

$Bri=1.44*Jem/[pi*k*T]$, where

Jem=usable emission current density=usable current/S [A/sq·cm]

pi=3.1415 . . .

k=8.617 333 262 . . . ×$10^{-5}$ eV $K^{-1}$, Boltzmann constant.

In some embodiments, operational ranges of values of Ao, A1, and b can be:

Ao=36.9+/−0.12[%],

A1=2.003E-20+/−2.00E-21[%], and b=38.5+/−0.08 [deg K]

In one embodiment the values of Ao, A1, and b can be:

Ao=36.9

A1=2.003E-20 b=38.5

In some other embodiments, a step-type method can be utilized to determine usable current criteria by looking up user-provided Schottky TFE temperature, which may be 1750K, or 1800K, or 1850K. Depending on temperature, pixels can be selected by applying the following criteria of usable current:

TABLE 1

| Schottky TFE temperature, K | Usable current criteria, pixel value with respect to max value |
|---|---|
| 1750 | ≤38% |
| 1800 | ≤41% |
| 1850 | ≤52% |

As illustrated in Table 1, the Schottky TFE beam profile changes with temperature: higher temperatures means that the usable current criteria are a higher percentage of the total pixel value, than at lower temperatures. This means at higher temperatures, e.g., 1850K, with over a 50% value, the performance can be diminished due to the dog ears of the Schottky TFE beam profile.

In some embodiments, user can provide TFE tip radius value, R, and pixels that meet usable current criteria are counted and a total area of these pixels is computed (software can process how many pixels total fit within R, finds size of 1 pixels, squares that value to determine area-per-individual-pixel.

Figure 9A:
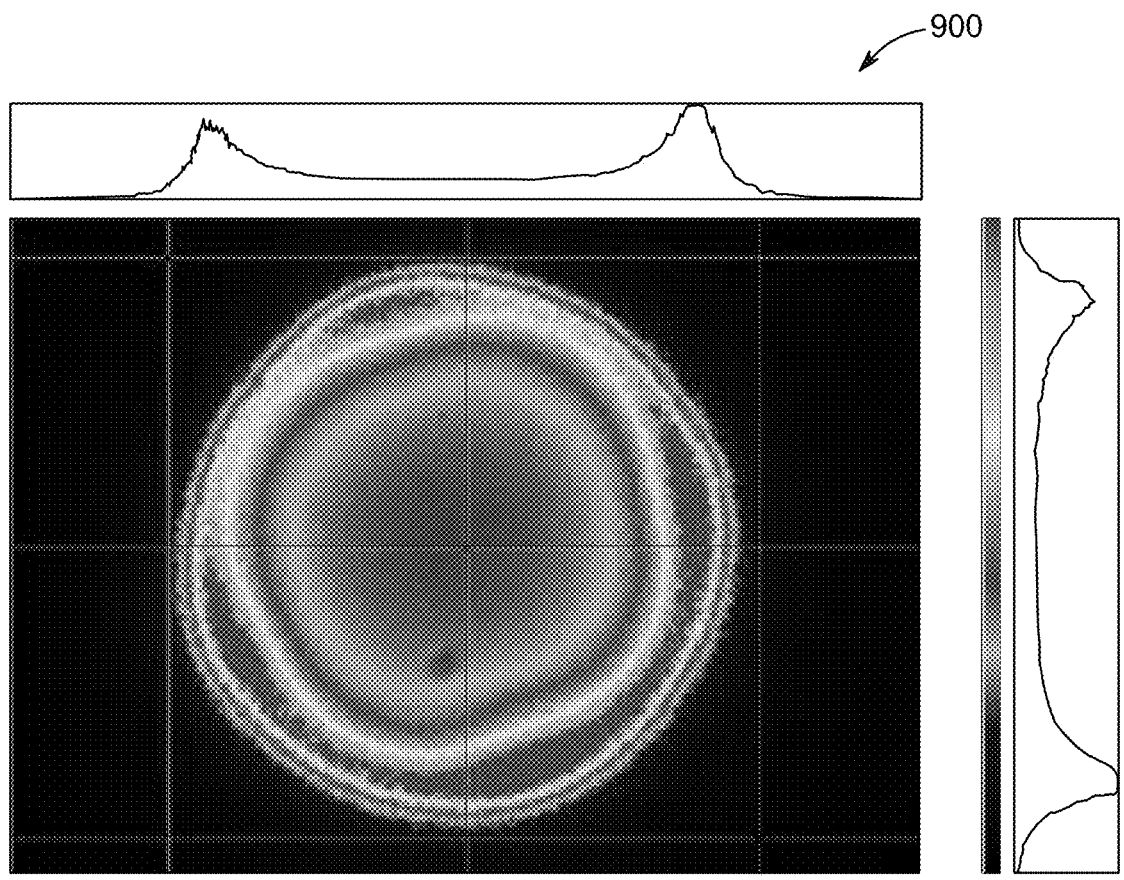
FIG. 9A illustrates a digitized Schottky TFE emission image, according to exemplary embodiments of the present disclosure.
Figure 9B:
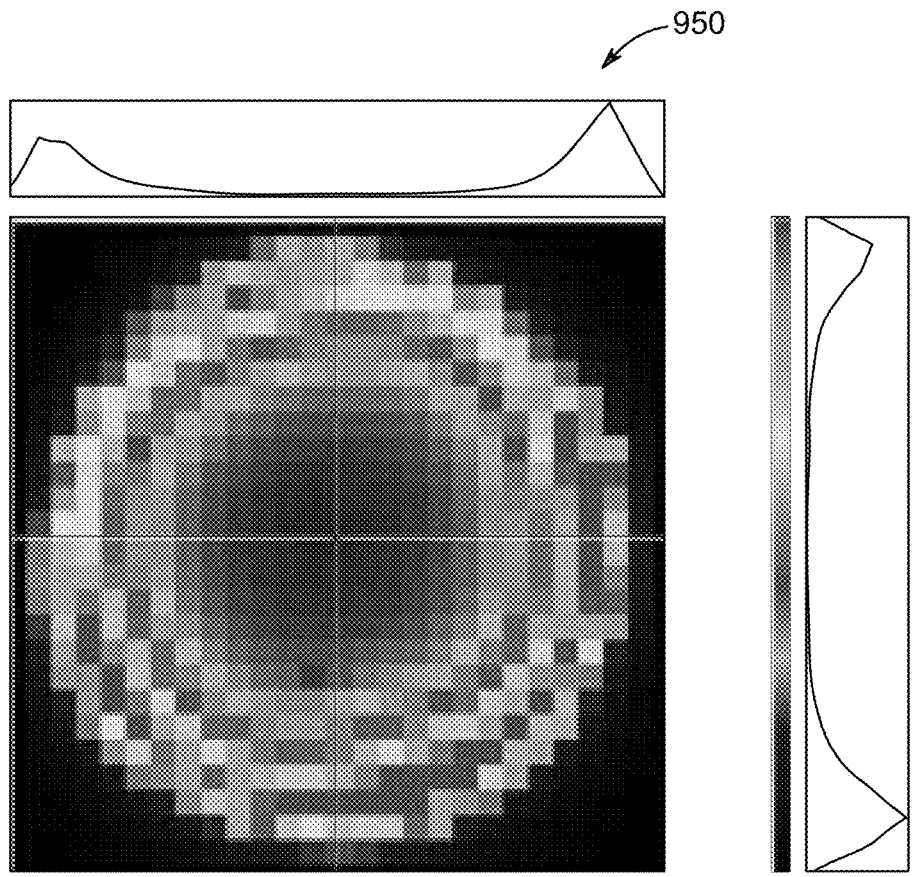
FIG. 9B illustrates an analyzed Schottky TFE emission image per FIG. 9A, according to exemplary embodiments of the present disclosure.

FIGS. 9A and 9B provide example embodiments 900 and 950, respectively, of the disclosed method of operation to evaluate Schottky TFE current and brightness. FIG. 9A illustrates a digitized Schottky TFE emission image, according to exemplary embodiments of the present disclosure. FIG. 9A shows relatively low intensity in a center circle (light colored), surrounded by high intensity on the edge, representing the dog ears (dark color). In one embodiment, this Schottky TFE emission image can be loaded into the emission analyzer graphics, with user-supplied beam current of 40 µA, temperature 1800K, and tip size 0.78 µm.

FIG. 9B illustrates an analyzed Schottky TFE emission image per FIG. 9A, according to exemplary embodiments of the present disclosure. FIG. 9B is a digitized and pixelized image, and a noteworthy example embodiment of measurable current and of usable current and brightness. Specifically, of the digitized and pixelized image of FIG. 9B displays a usable current of 5.239 µA and brightness of 1.291E8 A/sq·m*sr/V.

Figure 10:
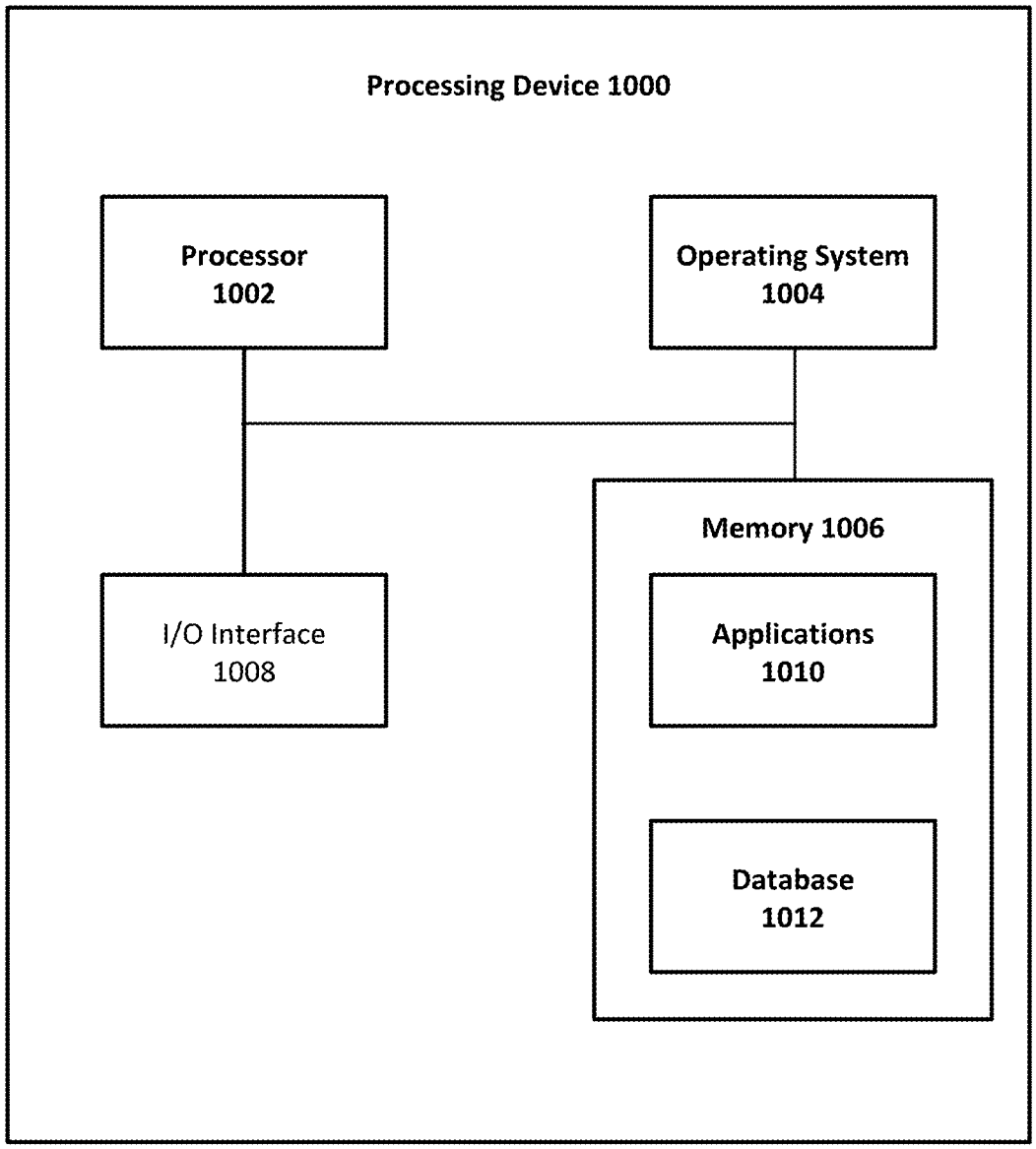
FIG. 10 is a diagram of a processing device for evaluating usable beam current and brightness in a Schottky TFE, according to some embodiments of the present disclosure.

FIG. 10 is a diagram of a processing device 1000 for evaluating usable beam current and brightness in a Schottky TFE, according to some embodiments of the present disclosure. FIG. 10 illustrates one block for each of processor 1002, operating system 1004, memory 1006, and I/O interface 1008. Memory 1006 may comprise application 1010 and database 1012. These blocks may represent one or more processors or processing circuitries, operating systems, memories, I/O interfaces, applications, and/or software modules. In other implementations, processing device 1000 may not have all of the components shown and/or may have other elements including other types of elements instead of, or in addition to, those shown herein.

In general, a computer that performs the processes described herein can include one or more processors and a memory (e.g., a non-transitory computer readable medium). The process data and instructions may be stored in the memory. These processes and instructions may also be stored on a storage medium such as a hard drive (HDD) or portable storage medium or may be stored remotely. Note that each of the functions of the described embodiments may be implemented by one or more processors or processing circuits. A processing circuit can include a programmed processor, as a processor includes circuitry. A processing circuit/circuitry may also include devices such as an application specific integrated circuit (ASIC) and conventional circuit components arranged to perform the recited functions. The processing circuitry can be referred to interchangeably as circuitry throughout the disclosure. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device.

The functions and features described herein may also be executed by various distributed components of a system. For example, one or more processors may execute the functions, wherein the processors are distributed across multiple components communicating in a network. The distributed components may include one or more client and server machines, which may share processing in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Those skilled in the art will understand that there can be many variations made to the operations of the techniques explained above while still achieving the same objectives of the invention. Such variations are intended to be covered by the scope of this disclosure. As such, the foregoing descriptions of embodiments of the invention are not intended to be limiting.

As a summary, the present disclosure is related to a Schottky TFE source for emitting an electron beam. Exemplary embodiments can provide the acquisition of high-resolution emission images of Schottky TFE and computing usable beam current and brightness based on experimentally developed criteria. Method steps can include configuring one or more processors for: acquiring and storing a Schottky TFE emission image of a Schottky TFE in a digital format; normalizing and summing pixel data values of the Schottky TFE emission image; assigning pixel current based on normalizing and summing pixel data values and a beam current; and determining a Schottky TFE usable current and brightness based on the assigned pixel current and usable current criteria, wherein the normalizing and the summing pixel data values further comprises counting pixels in the Schottky TFE emission image, summing up normalized pixel values, and normalizing the pixel values with reference to a maximum intensity parameter; moreover, wherein the assigning of the pixel current based on the normalizing and summing pixel data values and the beam current further comprises assigning each pixel a value proportional to its intensity, dividing user-provided beam current by the sum of normalized pixel values, and assigning resulting division output. The assigned pixel current can be introduced based on a fraction of the beam current, to each pixel. The beam current comprises a central beam component and an outer beam component The determining of the Schottky TFE usable current and brightness can further comprise combining the assigned pixel current by pixel normalized values and the usable current criteria, and wherein depending on TFE temperature T, pixels are selected by applying the usable current criteria. More specifically, the normalized pixel values P, with respect to a maximum value pixel current value, are based on the usable current criteria as follows:

$P = Ao + A1 * \text{EXP}(T/b)$, where,

Ao=a first usable current criterion, measured in percentage,
A1=a second usable current criterion, measured in percentage,
T=Schottky TFE temperature measured in degree K,
b=a third usable current criterion, measured in degree K, wherein the usable current criteria are based on experimentally developed criteria.
Additionally, operational ranges of values for Ao, A1 and b can be as follows: Ao=36.9+/−0.12[%], A1=2.003E-20+/−2.00E-21[%], and b=38.5+/−0.08 [deg K].

The assigned pixel currents of the pixels, which satisfy the first, second, and third usable current criteria, are summed up to form usable current, and a usable emission current density, Jem is determined by dividing the usable current by area S, which is determined by the pixels which satisfy the first, second, and third usable current criteria.

The usable Schottky TFE brightness, Bri, is determined based on the Schottky TFE usable current, the temperature T, and area S, wherein the area S is an area from which the usable current is generated. Bri can be calculated as follows:

$\text{Bri} = 1.44 * \text{Jem}/[\text{pi} * k * T]$, where,

Jem=usable emission current density=usable current/S [A/sq·cm], pi=3.1415 . . . , and k=8.617 333 262 . . . ×10-5 eV K−1, Boltzmann constant.

Upon completion of the evaluation, a report with graphical illustrations can be issued.

System embodiments and non-transitory computer readable medium embodiments can be configured to implement the method steps described above.

In another exemplary embodiment, a system for determining Schottky TFE usable current and brightness of a Schottky TFE, the system can comprise one or more processors and can be configured to: acquire and store a Schottky TFE emission image in a digital format; and determine usable beam current and brightness for the Schottky TFE based on experimentally developed algorithms that utilize usable current criteria and usable emission current density, wherein the usable current criteria are generated based on properties of central beam component and outer beam component of Schottky TFE beam current. Additionally, the determining of the usable beam current and brightness comprises: normalizing and summing pixel data values of the Schottky TFE emission image; assigning pixel current based on pixel normalized values and a beam current; and determining Schottky TFE usable current and brightness based on the assigned pixel current and usable current criteria, and wherein the normalizing and the summing pixel data values further comprises counting pixels in the Schottky TFE emission image, summing up normalized pixel values, and normalizing the pixel values with reference to a maximum intensity parameter. The assigning of the pixel current based on the pixel normalized values and the beam current can comprise assigning each pixel a value proportional to its intensity, dividing user-provided beam current by the sum of normalized pixel values, and assigning resulting division output. The determining of the Schottky TFE usable current and brightness can further comprise combining the assigned pixel current by pixel normalized values and the usable current criteria, and wherein depending on TFE temperature T, pixels are selected by applying the usable current criteria. In an exemplary embodiment, the results of the determined usable beam current and brightness evaluation for the Schottky TFE can be utilized for operation of multi-beam electronic optical tools.

The invention claimed is:

1. A method of determining a Schottky thermal field emission (TFE) usable current and brightness, the method comprising:
configuring one or more processors for:
acquiring and storing in a memory a Schottky TFE emission image of a Schottky TFE source in a digital format;
normalizing and summing pixel data values of the acquired and stored Schottky TFE emission image;
assigning a pixel current based on the normalized and summed pixel data values and a beam current, wherein the beam current comprises a central beam component and an outer beam component; and
determining a Schottky TFE usable current and brightness based on the assigned pixel current and usable current criteria,
wherein the assigning of the pixel current based on the normalized and summed pixel values and the beam current further comprises assigning each pixel a value proportional to each pixel's intensity, dividing the beam current by the sum of normalized pixel values, and assigning resulting division output, and wherein the assigned pixel current is introduced to each pixel based on a fraction of the beam current.

2. The method of claim 1, wherein the normalizing and the summing pixel data values further comprise counting pixels in the Schottky TFE emission image, summing up normalized pixel values, and normalizing the pixel values with reference to a maximum intensity parameter.

3. The method of claim 1, wherein the central beam component, compared to the outer beam component, comprises lower divergence angles relative to horizontal axis and narrower energy spread, and the outer beam component, compared to the central beam component, comprises higher divergence angles and wider energy spread.

4. The method of claim 1, wherein the usable beam current and brightness are maximized for use in multi-beam electron optical tools.

5. The method of claim 1,
wherein the determining of the Schottky TFE usable current and brightness further comprises combining the assigned pixel current by pixel normalized values and the usable current criteria, and
wherein, depending on Schottky TFE temperature T, pixels are selected by applying the usable current criteria.

6. The method of claim 5, wherein normalized pixel values P, with respect to a maximum value pixel current value, are based on the usable current criteria as follows:

$P = Ao + A1 * EXP(T/b)$, where,

Ao is a first usable current criterion, measured in percentage,
A1 is a second usable current criterion, measured in percentage,
T is a Schottky TFE temperature measured in degrees K, and
b is a third usable current criterion, measured in degrees K,
wherein the usable current criteria are based on experimentally developed criteria.

7. The method of claim 6, wherein the first usable current criterion, the second usable current criterion, and the third usable current criterion have operational ranges of values as follows:
Ao=36.9+/−0.12[%],
A1=2.003E-20+/−2.00E-21[%], and
b=38.5+/−0.08 [degrees K].

8. The method of claim 5, wherein assigned pixel currents of the pixels, which satisfy a first usable current criterion, a second usable current criterion, and a third usable current criterion, are summed up to form usable current, and a usable emission current density, Jem, is determined by dividing the usable current by area S.

9. The method of claim 5,
wherein usable Schottky TFE brightness, Bri, is determined based on the Schottky TFE usable current, the temperature T, and area S, and
wherein the area S is an area from which the usable current is generated.

10. The method of claim 9, wherein $Bri = 1.44 * Jem / [pi * k * T]$, where

Jem=usable emission current density=usable current/S [A/sq·cm]
pi=3.1415 . . . , and
k=8.617 333 262 . . . ×$10^{-5}$ eV $K^{-1}$, Boltzmann constant.

11. The method of claim 1, wherein the usable current criteria are experimentally determined based on properties of central beam component and outer beam component of Schottky TFE beam current.

12. A non-transitory computer readable medium having instructions stored therein that, when executed by one or more processors, cause the one or more processors to perform a method to determine Schottky thermal field emission (TFE) usable current and brightness of a Schottky TFE source, the method comprising:
acquiring and storing to a memory a Schottky TFE emission image in a digital format;
normalizing and summing pixel data values of the acquired and stored Schottky TFE emission image;
assigning a pixel current based on the normalized and summed pixel data values and a beam current, wherein the beam current comprises a central beam component and an outer beam component; and
determining Schottky TFE usable current and brightness based on the assigned pixel current and usable current criteria,
wherein the assigning of the pixel current based on the normalized and summed pixel values and the beam current further comprises assigning each pixel a value proportional to each pixel's intensity, dividing beam current by the sum of normalized pixel values, and assigning resulting fraction of the beam current to each pixel.

13. The non-transitory computer readable medium of claim 12, wherein the normalizing and the summing pixel data values further comprises counting pixels in the Schottky TFE emission image, summing up normalized pixel values, and normalizing the pixel values with reference to a maximum intensity parameter.

14. The non-transitory computer readable medium of claim 12, wherein the assigning of the pixel current based on the pixel normalized values and the beam current further comprises assigning each pixel a value proportional to its intensity, dividing user-provided beam current by the sum of normalized pixel values, and assigning resulting division output, wherein the assigned pixel current is introduced to each pixel based on a fraction of the beam current.

15. The non-transitory computer readable medium of claim 12, wherein depending on Schottky TFE temperature T, pixels are selected by applying the usable current criteria.

* * * * *